United States Patent
Nie et al.

(10) Patent No.: US 12,271,221 B2
(45) Date of Patent: Apr. 8, 2025

(54) CLOCK CALIBRATION METHOD AND ELECTRONIC DEVICE

(71) Applicant: SHENZHEN GOODIX TECHNOLOGY CO., LTD., Shenzhen (CN)

(72) Inventors: Hongsong Nie, Shenzhen (CN); Ke Zhang, Shenzhen (CN)

(73) Assignee: SHENZHEN GOODIX TECHNOLOGY CO., LTD., Shenzhen (CN)

( * ) Notice: Subject to any disclaimer, the term of this patent is extended or adjusted under 35 U.S.C. 154(b) by 0 days.

(21) Appl. No.: 18/501,142

(22) Filed: Nov. 3, 2023

(65) Prior Publication Data
US 2024/0069591 A1    Feb. 29, 2024

Related U.S. Application Data

(63) Continuation of application No. PCT/CN2021/099022, filed on Jun. 8, 2021.

(51) Int. Cl.
*G06V 40/13*        (2022.01)
*G06F 1/08*         (2006.01)

(52) U.S. Cl.
CPC ............ *G06F 1/08* (2013.01); *G06V 40/13* (2022.01)

(58) Field of Classification Search
None
See application file for complete search history.

(56) References Cited

U.S. PATENT DOCUMENTS

| | | | |
|---|---|---|---|
| 2010/0320553 A1* | 12/2010 | Setlak | G06F 21/32 257/443 |
| 2019/0267976 A1 | 8/2019 | Xu et al. | |
| 2020/0159278 A1 | 5/2020 | Pereira et al. | |

FOREIGN PATENT DOCUMENTS

| | | |
|---|---|---|
| CN | 102830748 A | 12/2012 |
| CN | 109283967 A | 1/2019 |
| CN | 111541450 A | 8/2020 |
| CN | 111665431 A | 9/2020 |
| CN | 111897201 A | 11/2020 |

(Continued)

OTHER PUBLICATIONS

Machine Translation of CN102830748, 2012.*
PCT International search report of PCT/CN2021/099022, issued on Feb. 25, 2022.

*Primary Examiner* — Joseph R Haley
(74) *Attorney, Agent, or Firm* — Emerson, Thomson & Bennett, LLC; Roger D. Emerson; Seth J. Niemi

(57) ABSTRACT

A clock calibration method and an electronic device, for calibrating a clock of a fingerprint chip, which can improve an accuracy of the clock of the fingerprint chip, thereby improving performance of the fingerprint chip. The clock calibration method, for calibrating a clock of a fingerprint chip provided in an electronic device, includes: sending a configuration command to the fingerprint chip to cause the fingerprint chip to map a current clock of the fingerprint chip to a target pin of the fingerprint chip; detecting the target pin to acquire the current clock of the fingerprint chip; determining a calibration value based on a target clock and the current clock of the fingerprint chip; and sending the calibration value to a calibration register in the fingerprint chip, the calibration value being used to adjust the current clock of the fingerprint chip.

18 Claims, 9 Drawing Sheets

(56) References Cited

FOREIGN PATENT DOCUMENTS

| CN | 111934678 | A | 11/2020 |
| CN | 112148064 | A | 12/2020 |
| CN | 112269424 | A | 1/2021 |
| CN | 112327596 | A | 2/2021 |

* cited by examiner

CLOCK CALIBRATION METHOD AND ELECTRONIC DEVICE

CROSS REFERENCE TO RELATED APPLICATIONS

The present application is a continuation of international application No. PCT/CN2021/099022, filed on Jun. 8, 2021, which is hereby incorporated by reference in its entirety.

TECHNICAL FIELD

The present disclosure relates to the field of chip technology, and in particular, to a clock calibration method and an electronic device.

BACKGROUND

A clock source circuit in a fingerprint chip provides a clock for each functional module in the chip, to ensure proper operation of functions such as analog-to-digital converter, data communication, and pixel exposure in the chip, therefore, an accuracy of the clock is particularly important.

As an example, the clock source circuit in the fingerprint chip may be realized using an RC oscillator. The main advantage of the RC oscillator is simple structure, economical and convenient. However, its disadvantages are also prominent. The RC oscillator is highly affected by temperature, resistance temperature drift and capacitance accuracy, and has a poor process consistency. Therefore, the clock accuracy acquired by the RC oscillator is poor, which may have a large impact on performance of the fingerprint chip.

Based on this, how to improve the accuracy of the clock in the fingerprint chip, so as to improve the performance of the fingerprint chip is an urgent technical problem.

SUMMARY

The present disclosure provides a clock calibration method, a clock calibration apparatus, and an electronic device, for calibrating a clock of a fingerprint chip, which can improve an accuracy of the clock of the fingerprint chip, thereby improving performance of the fingerprint chip.

In a first aspect, a clock calibration method is provided, for calibrating a clock of a fingerprint chip provided in an electronic device. The method includes: sending a configuration command to the fingerprint chip to cause the fingerprint chip to map a current clock of the fingerprint chip to a target pin of the fingerprint chip; detecting the target pin to acquire the current clock of the fingerprint chip; determining a calibration value based on a target clock and the current clock of the fingerprint chip; and sending the calibration value to a calibration register in the fingerprint chip, the calibration value being used to adjust the current clock of the fingerprint chip.

In the technical solution of embodiments of the present disclosure, by sending the configuration command to the fingerprint chip, the current clock of the fingerprint chip may be mapped to the target pin, so that the current clock of the fingerprint chip at the target pin may be detected in real time, and the current clock of the fingerprint chip may be adjusted in real time based on the current clock of the fingerprint chip and the actual desired target clock. The technical solution of the embodiments of the present disclosure is not performed in a wafer phase, for calibrating the clock of a fingerprint die (Die), but may be performed after the fingerprint die is packaged, and real-time clock calibration may be performed on the fingerprint chip that is packaged and provided in the electronic device, e.g., clock calibration may be performed on the fingerprint chip, when it is assembled in the electronic device and tested ex-factory, or clock calibration may be performed on the fingerprint chip during use of the electronic device by a user. Therefore, based on the real-time adjustment to the clock of the fingerprint chip, the accuracy of the clock of the fingerprint chip may be improved, thus improving the performance of the fingerprint chip.

In some possible embodiments, a communication pin of the fingerprint chip is multiplexed as the target pin of the fingerprint chip, the communication pin of the fingerprint chip is a serial peripheral interface SPI pin or a general-purpose input/output GPIO pin, and the current clock of the fingerprint chip includes any of: a clock source clock, a clock of an exposure module, a clock of an analog-to-digital conversion module, a clock of a communication module and a clock of a clock calibration module.

In some possible embodiments, the determining a calibration value based on a target clock and the current clock of the fingerprint chip, includes: determining the calibration value by dichotomy based on a difference between a frequency of the target clock and a frequency of the current clock.

In some possible embodiments, the determining the calibration value by dichotomy, based on a difference between a frequency of the target clock and a frequency of the current clock, includes: acquiring a current value of the calibration register in the fingerprint chip; when the difference between the frequency of the target clock and the frequency of the current clock is positive, determining the calibration value based on the current value and a first formula, the first formula being: $C'=C+\lceil(C_{max}-C)/2\rceil$; or when the difference between the frequency of the target clock and the frequency of the current clock is negative, determining the calibration value based on the current value and a second formula, the second formula being $C'=C+\lceil(C-C_{min})/2\rceil$; where $C'$ is the calibration value, $C$ is the current value, and $C_{min}$ and $C_{max}$ are respectively a minimum value and a maximum value that can be stored into the calibration register.

In some possible embodiments, the determining a calibration value based on a target clock and the current clock of the fingerprint chip, includes: determining the calibration value based on a difference between a frequency of the target clock and a frequency of the current clock, and a preset frequency-calibration value mapping relationship; where the mapping relationship includes: a mapping formula, a mapping table or a mapping diagram.

In some possible embodiments, the determining the calibration value based on a difference between a frequency of the target clock and a frequency of the current clock, and a preset frequency-calibration value mapping relationship, includes: determining, based on a current value of the calibration register in the fingerprint chip and the mapping relationship, a mapping frequency corresponding to the current value; determining a calibration frequency, based on the difference between the frequency of the target clock and the frequency of the current clock and the mapping frequency; and determining the calibration value corresponding to the calibration frequency, based on the calibration frequency and the mapping relationship.

In some possible embodiments, the preset frequency-calibration value mapping relationship is a frequency-calibration value mapping relationship obtained by determining experimental data or simulation data.

In some possible embodiments, the detecting the target pin to acquire the current clock of the fingerprint chip, includes: detecting the target pin to capture n pulse signals of the current clock of the fingerprint chip, where n is a positive integer; the determining a calibration value based on a target clock and the current clock of the fingerprint chip, includes: determining the frequency of the current clock based on time for the n pulse signals; and determining the calibration value based on the difference between the frequency of the target clock and the frequency of the current clock.

In some possible embodiments, the detecting the target pin to capture n pulse signals of the current clock of the fingerprint chip, includes: acquiring a sampling clock, where the sampling clock is a clock in the electronic device; detecting the target pin based on the sampling clock, capturing n rising edges or falling edges of the current clock of the fingerprint chip to capture the n pulse signals of the current clock; where, a frequency of the sampling clock is more than twice the frequency of the current clock of the fingerprint chip.

In some possible embodiments, the clock calibration method further includes: when an absolute value of a difference between a period of the adjusted current clock of the fingerprint chip and a period of the target clock is less than or equal to a preset threshold, storing the calibration value. The preset threshold is greater than or equal to 0, and less than or equal to exposure time for a row of pixels in the fingerprint chip, or the preset threshold is greater than or equal to 0, and less than or equal to unit adjustable time for the calibration register.

In some possible embodiments, the calibration value is stored into a storage unit of the fingerprint chip.

In some possible embodiments, the clock calibration method further includes: determining, when the difference between the adjusted current clock of the fingerprint chip and the target clock does not satisfy a preset condition, a new calibration value based on the target clock and the adjusted current clock of the fingerprint chip, and sending the new calibration value to the calibration register in the fingerprint chip, where the new calibration value is used to continue to adjust the current clock of the fingerprint chip.

In some possible embodiments, the clock calibration method is applied to a processor of the electronic device, and the processor is configured to calibrate the clock of the fingerprint chip provided in the electronic device.

In a second aspect, a clock calibration method is provided, applied to a fingerprint chip provided in an electronic device, including: receiving a configuration command, mapping a current clock of the fingerprint chip to a target pin based on the configuration command, to output the current clock from the target pin; receiving a calibration value for the current clock, and writing the calibration value into a calibration register; and adjusting the current clock based on the calibration value.

In some possible embodiments, a communication pin of the fingerprint chip is multiplexed as the target pin.

In some possible embodiments, a serial peripheral interface SPI pin or a general-purpose input/output GPIO pin of the fingerprint chip is multiplexed as the target pin.

In some possible embodiments, the current clock of the fingerprint chip includes any of: a clock source clock, a clock of an exposure module, a clock of an analog-to-digital conversion module, a clock of a communication module and a clock of a clock calibration module.

In some possible embodiments, the clock calibration method further includes: receiving a storage instruction; and storing the calibration value based on the storage instruction, where the storage instruction is used to indicate that the difference between the adjusted current clock and the target clock satisfies a preset condition.

In some possible embodiments, the clock calibration method further includes: receiving a new calibration value for the adjusted current clock, and writing the new calibration value into the calibration register; and continuing to adjust the current clock based on the new calibration value.

In some possible embodiments, the configuration command and the calibration value are sent by a processor of the electronic device.

In a third aspect, an electronic device is provided, including a processor and a fingerprint chip. The processor includes a clock calibration apparatus for calibrating a clock of the fingerprint chip, the clock calibration apparatus including: a sending unit, configured to send a configuration command to the fingerprint chip to cause the fingerprint chip to map a current clock of the fingerprint chip to a target pin of the fingerprint chip; a detection unit, configured to detect the target pin to acquire the current clock of the fingerprint chip; a processing unit, configured to determine a calibration value based on a target clock and the current clock of the fingerprint chip; and the sending unit, further configured to send the calibration value to a calibration register in the fingerprint chip, the calibration value being used to adjust the current clock of the fingerprint chip, and or, the fingerprint chip includes a clock calibration apparatus, the clock calibration apparatus including: a receiving unit, configured to receive a configuration command; a mapping unit, configured to map a current clock of the fingerprint chip to a target pin based on the configuration command, to output the current clock from the target pin; the receiving unit, further configured to receive a calibration value for the current clock, and write the calibration value into a calibration register; and an adjusting unit, configured to adjust the current clock based on the calibration value.

DETAILED DESCRIPTION OF EMBODIMENTS

The technical solution in embodiments of the present disclosure will be described below in conjunction with the accompanying drawings.

In order to improve an accuracy of the clock in the fingerprint chip, in some related arts, in a wafer manufacturing phase of the fingerprint chip, a clock of a fingerprint die (Die) may be tested by means of an external tool such as a tester and a test fixture, to determine a difference between the clock of the fingerprint die and an actual desired target clock, then contact a communication interface in the fingerprint die with a probe to configure a value of a relevant register in the fingerprint die, so as to adjust the clock of the fingerprint die, making it close to or equal to the target clock. In the above technical solution, clock calibration performed on the fingerprint die may be referred to as Trim, the register in the fingerprint die for calibrating the clock may be referred to as a calibration register or a Trim register, and the value stored into the calibration register may also be referred to as a calibration value, a Trim value, or a Trim code.

Figure 1:
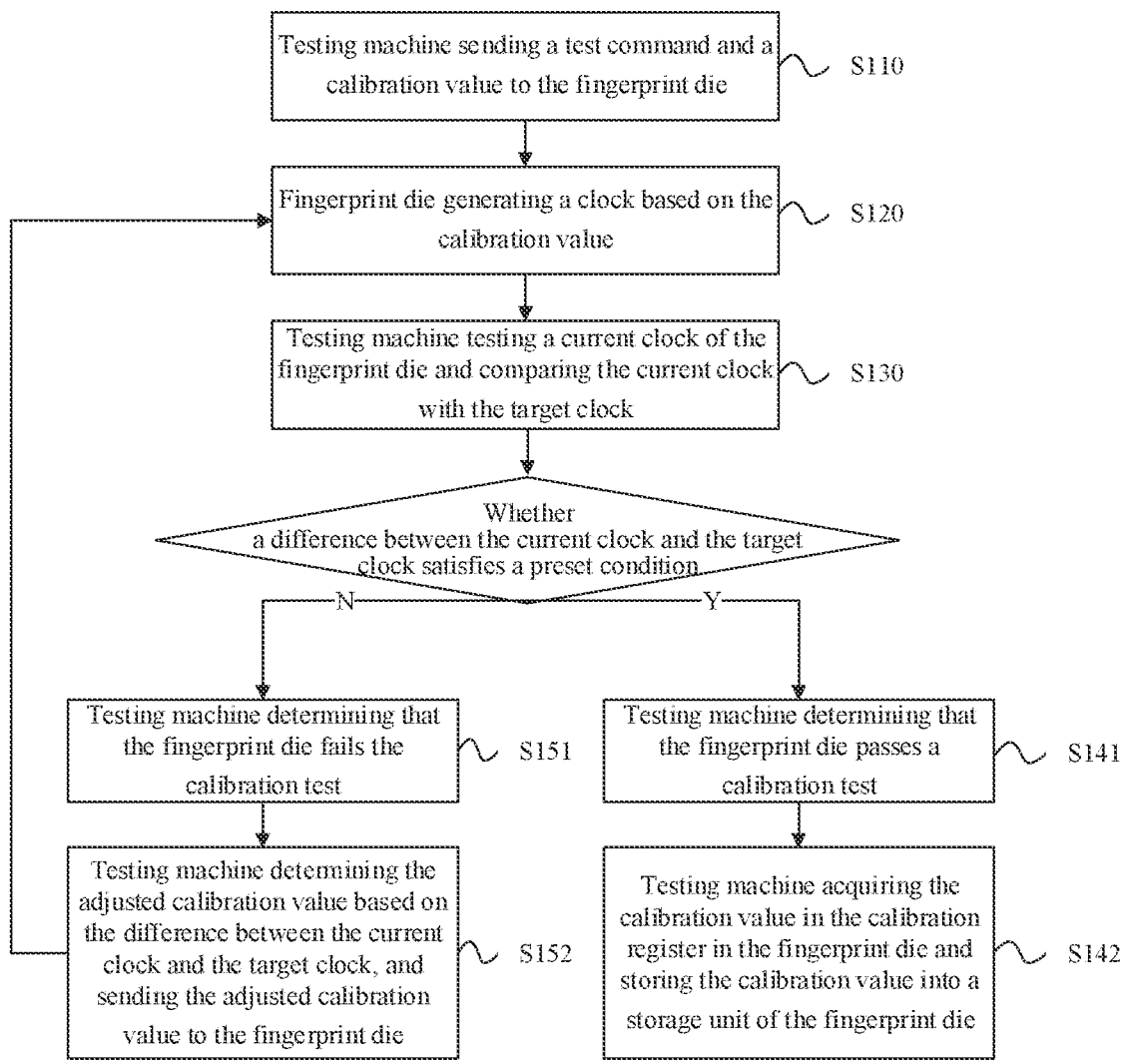
FIG. 1 is a schematic flow block diagram of a clock calibration method of a fingerprint die provided according to an embodiment of the present disclosure.

FIG. 1 illustrates a schematic flow block diagram of a method 100 for calibrating a clock of a fingerprint die in a wafer manufacturing phase.

As shown in FIG. 1, the method 100 for calibrating a clock may include the following steps:

S110: a testing machine sending a test command and a calibration value to the fingerprint die.

Alternatively, the testing machine may include a processor, a frequency tester, a probe and other components. The processor is configured to form a test command and process test data, the frequency tester is used to perform frequency testing on the clock of the fingerprint die, and the probe may contact test points such as test pads in the fingerprint die and is used to transmit the relevant command of the testing machine to the fingerprint die, and to transmit a relevant signal and data generated by the fingerprint die to the testing machine. It may be understood that the above functional components in the testing machine are only examples, the testing machine may also be designed to include more functional components based on actual needs, and each functional component in the testing machine may be discrete multiple test instruments or may be integrated as one testing equipment.

In this step, the test command and the initial calibration value of the testing machine may be sent to the fingerprint die via the probe, the test command is used to indicate the fingerprint die to enter a clock test phase, and the calibration value may include the initial calibration value as well as an adjusted calibration value, where the initial calibration value may be used as an initial preset value of the calibration register (Trim register) in the fingerprint die for an initial adjustment to the clock of the fingerprint die, and the adjusted calibration value is a calibration value generated in a subsequent adjustment process after the initial adjustment to the clock, which may be described in detail below.

S120: the fingerprint die generating a clock based on the calibration value.

Specifically, the calibration value sent by the testing machine may be written into the Trim register in the fingerprint die, and the fingerprint die may generate the clock based on the calibration value.

In some possible implementations, the fingerprint die includes a clock source circuit and a calibration circuit thereof, the calibration circuit is used to adjust a circuit parameter of the clock source circuit based on the Trim code stored into the Trim register to adjust the clock generated by the clock source circuit. In this step, the calibration circuit is used to adjust the circuit parameter of the clock source circuit based on the calibration value stored into the Trim register, so as to cause the clock source circuit to generate the clock.

S130: the testing machine testing a current clock of the fingerprint die and comparing the current clock with the target clock.

Alternatively, the frequency tester in the testing machine may also test the current clock generated by the clock source circuit in the fingerprint die via the probe, then the frequency tester may send the current clock obtained from the test to the processor in the testing machine, the processor is configured to compare the current clock with the target clock and determine whether a difference between the current clock and the target clock satisfies a preset condition, for example, determining whether the difference between the current clock and the target clock is within a preset range, which may be a permissible clock error range for the fingerprint die.

S141: when the difference between the current clock and the target clock satisfies the preset condition, the testing machine determining that the fingerprint die passes a calibration test.

S142: the testing machine acquiring the calibration value in the calibration register in the fingerprint die and storing the calibration value into a storage unit of the fingerprint die.

Alternatively, when the difference between the current clock and the target clock is within the preset range, it indicates that the current clock generated by the fingerprint die meets the actual needs and has a high accuracy. In this regard, the testing machine acquires the current Trim code in the Trim register in the fingerprint die and stores the Trim code in the storage unit of the fingerprint die, e.g., into a One Time Programmable (OTP) storage unit of the fingerprint die, so that the Trim code may be read from the OTP storage unit and form a clock during subsequent operation of the fingerprint chip.

S151: when the difference between the current clock and the target clock does not satisfy the preset condition, the testing machine determining that the fingerprint die fails the calibration test.

S152: the testing machine determining the adjusted calibration value based on the difference between the current clock and the target clock, and sending the adjusted calibration value to the fingerprint die.

Alternatively, when the difference between the current clock and the target clock is outside the preset range, it indicates that the current clock generated by the fingerprint die in this regard does not meet the actual needs and needs to be adjusted.

Alternatively, the testing machine acquires the current Trim code in the Trim register in the fingerprint die and adjusts the current Trim code based on an absolute value of the difference between the current clock and the target clock and positive or negative, determines the adjusted Trim code and sends the adjusted Trim code to the fingerprint die.

Specifically, after this step S152, step S120 above and its subsequent steps may be performed continuously in a loop until the difference between the current clock of the fingerprint die and the target clock satisfies the preset condition, then the testing machine determines that the fingerprint die passes the calibration test.

Combined with FIG. 1, the foregoing illustrates a clock calibration method of a fingerprint die in the wafer manufacturing phase, using this method, the calibrated Trim code of the fingerprint die may be obtained, and the calibrated Trim code may be stored into the storage unit of the fingerprint die. During general process manufacturing, the fingerprint die, after going through the above clock calibration and other tests, may form a packaged fingerprint chip through processes such as packaging, and the fingerprint chip may also go through a test phase such as a reliability test before it can be assembled in an electronic device such as a cell phone terminal. After being assembled in the electronic device, the fingerprint chip generates a corresponding clock based on the Trim code in the storage unit, for executing actual fingerprint detection.

During this process manufacturing, clock calibration may be performed on the fingerprint chip only in the wafer phase, and the Trim code obtained in this phase has a high accuracy for the fingerprint die only, while the formed fingerprint chip may be assembled in the electronic device only after the fingerprint die going through subsequent processes or subsequent tests (e.g., packaging process, reliability test, etc.). Due to the fact that the subsequent processes or subsequent tests need to be performed in high and low temperatures and/or high humidity environments, electrical devices in the fingerprint chip may be affected by high and low temperatures and/or high humidity, resulting in a drift of electrical parameters, thus causing the clock generated by the fingerprint chip to drift. In other words, the clock generated by the fingerprint chip based on the Trim code in the storage unit thereof, formed from the fingerprint die after going through the subsequent processes and tests, may drift relative to the actual desired target clock, resulting in a low accuracy of the clock of the fingerprint chip, and affecting a fingerprint detection function of the fingerprint chip.

Figure 2:
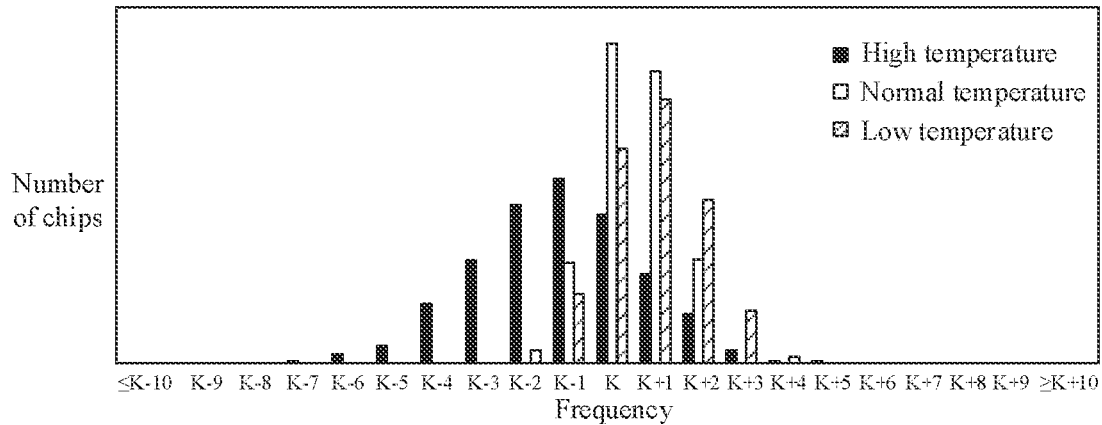
FIG. 2 is a schematic diagram of clock frequency distribution of a plurality of fingerprint chips under influence of different temperatures provided according to an embodiment of the present disclosure.

As an example, FIG. 2 illustrates a schematic diagram of clock frequency distribution of a plurality of fingerprint chips under influence of different temperatures.

In this example, the plurality of fingerprint chips are fingerprint chips that have been clock-calibrated in the wafer phase, but under the influence of different temperatures, the frequencies of the fingerprint chips show different frequency distributions varying with different temperatures.

As shown in FIG. 2, a target clock frequency of all fingerprint chips is the target frequency K. The clock frequency distribution of multiple fingerprint chips affected by high temperature is shifted to the left with respect to the target frequency K, i.e., the overall clock frequency of the multiple fingerprint chips affected by high temperature is lower with respect to the target frequency K. Conversely, the frequency distribution of multiple fingerprint chips affected by low temperature is shifted to the right with respect to the target frequency K, i.e., the overall clock frequency of the multiple fingerprint chips affected by low temperature is higher with respect to the target frequency K.

Specifically, the clock frequency shift of the fingerprint chip may bring the following problems: (1) cause pixel exposure time for the fingerprint chip to be inaccurate, which makes a fingerprint image collected by the fingerprint chip show horizontal stripes and affects detection performance; (2) affect data communication between the fingerprint chip and the external world, which causes problems such as commands not being sent and received properly, abnormalities in data reading, and memory overflow; and (3) reduce a signal-to-noise ratio of analog-to-digital converter (ADC). Of course, in addition to the above problems, the clock frequency shift may also affect other clock-related functions in the fingerprint chip, detailed description thereof will be omitted.

Based on the above technical problems, the present disclosure further provides a clock calibration method of a fingerprint chip, which may dynamically adjust the clock of the fingerprint chip provided in the electronic device in real time, and reduce or even avoid impact of process manufacturing and usage environment changes on the clock of the fingerprint chip.

Figure 3:
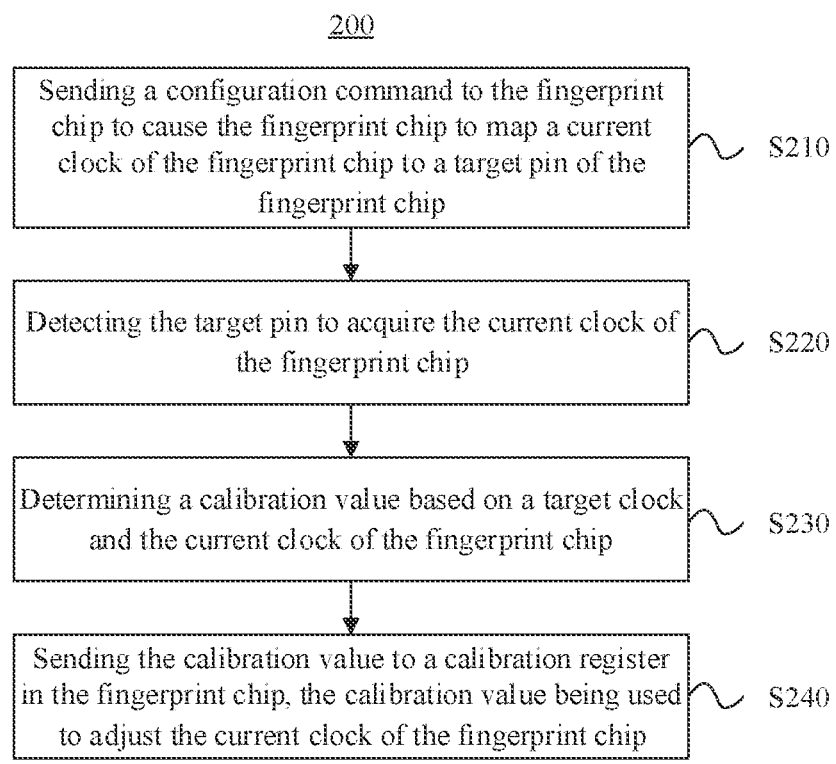
FIG. 3 is a schematic flow block diagram of a clock calibration method of a fingerprint chip provided according to an embodiment of the present disclosure.

FIG. 3 illustrates a schematic flow block diagram of a method 200 for calibrating a clock of a fingerprint chip provided in the present disclosure. The method 200 for calibrating a clock is for calibrating a clock of a fingerprint chip provided in an electronic device. In some embodiments, an executing body of the method 200 for calibrating a clock may be a processor of the electronic device in which the fingerprint chip is provided, the processor may be connected to the fingerprint chip, and mutual communication may be established between the processor and the fingerprint chip.

As shown in FIG. 3, the method 200 for calibrating a clock of a fingerprint chip may include the following steps:

S210: sending a configuration command to the fingerprint chip to cause the fingerprint chip to map a current clock of the fingerprint chip to a target pin of the fingerprint chip.

S220: detecting the target pin to acquire the current clock of the fingerprint chip.

S230: determining a calibration value based on a target clock and the current clock of the fingerprint chip.

S240: sending the calibration value to a calibration register in the fingerprint chip, the calibration value being used to adjust the current clock of the fingerprint chip.

Specifically, in this embodiment of the present disclosure, the fingerprint chip is a packaged chip, and the target pin thereof is an external pin of the fingerprint chip electrically connected to an external electrical component after the fingerprint chip is packaged.

Alternatively, the target pin may be an existing pin of the fingerprint chip, and the clock of the fingerprint chip may be mapped to the target pin through relevant configuration, thereby outputting the clock of the fingerprint chip. In some embodiments, a plurality of registers in the fingerprint chip may be configured to realize that the fingerprint chip is in different operating states, and various pins of the fingerprint chip may be used to output different electrical signals. Based on this, the plurality of registers in the fingerprint chip may be configured to map the current clock of the fingerprint chip to the target pin, such that the target pin may be used to output the current clock of the fingerprint chip.

As an example, the target pin may be an existing data communication pin or interrupt pin, etc. in the fingerprint chip, where the data communication pin includes, but is not limited to, a serial peripheral interface (SPI) pin, a general-purpose input/output (GPIO) pin, or the like. In this case, the target pin may be used to output the current clock of the fingerprint chip in addition to realizing the existing data communication function of the fingerprint chip.

Alternatively, the target pin may also be an added pin of the fingerprint chip, and similarly, the clock of the fingerprint chip may be mapped to the target pin through relevant configuration, thereby outputting the clock of the fingerprint chip. In this embodiment, the target pin is only used to realize outputting the clock of the fingerprint chip, and is not used to perform other functions of the fingerprint chip.

After the current clock of the fingerprint chip is output at the target pin, the current clock of the fingerprint chip may be acquired by detecting the target pin. Alternatively, a clock having high accuracy and frequency may be acquired as a sampling clock, and the current clock of the fingerprint chip at the target pin may be detected based on the sampling clock, which may improve an accuracy of detecting the current clock of the fingerprint chip.

In some embodiments, the electronic device in which the fingerprint chip is provided has a clock with high precision and accuracy and high frequency, for example, a clock of a central processing unit (CPU) of the electronic device, and the above sampling clock may be obtained by a frequency divider based on the clock of the central processing unit.

Further, after detecting to obtain the current clock of the fingerprint chip, the calibration value may be determined based on the current clock of the fingerprint chip and the target clock. The calibration value is used to adjust a current value of the calibration register in the fingerprint chip to adjust the current clock of the fingerprint chip. Specifically, the target clock in this embodiment of the present disclosure is an ideal clock determined based on actual needs, i.e., the target clock has an ideal waveform and has an ideal error-free frequency and phase.

Alternatively, in this embodiment of the present disclosure, the calibration register in the fingerprint chip and the value stored therein may be the Trim register and the Trim code, respectively, in the embodiment as shown in FIG. 1. In some embodiments, after determining the calibration value based on the current clock of the fingerprint chip and the target clock, the current value of the Trim register in the fingerprint chip may be adjusted to that calibration value, further, the calibration circuit in the fingerprint chip may adjust the current clock of the fingerprint chip based on the calibration value.

In the technical solution of this embodiment of the present disclosure, by sending the configuration command to the fingerprint chip, the current clock of the fingerprint chip may be mapped to the target pin, so that the current clock of the fingerprint chip at the target pin may be detected in real time, and the current clock of the fingerprint chip may be adjusted in real time based on the current clock of the fingerprint chip and the actual desired target clock.

Rather than performed in the wafer phase for calibrating the clock of the fingerprint die, the technical solution of this embodiment of the present disclosure may be performed after the fingerprint die is packaged, and clock calibration is performed on the packaged fingerprint chip, for example, clock calibration may be performed on the fingerprint chip, when the fingerprint chip is assembled in the electronic device and tested ex-factory, or clock calibration may be performed on the fingerprint chip during use of the electronic device by a user. Therefore, based on the real-time adjustment to the clock of the fingerprint chip, the accuracy of the clock of the fingerprint chip may be improved, thus improving the performance of the fingerprint chip. Specifically, improving the accuracy of the clock, may avoid inaccuracy of the clock affecting the exposure time for the fingerprint chip, so as to avoid a fingerprint image collected by the fingerprint chip from showing horizontal stripes and affecting the performance of fingerprint detection. In addition, improving the accuracy of the clock, may also avoid inaccuracy of the clock from affecting the data communication between the fingerprint chip and the external. Thirdly, improving the accuracy of the clock, may also reduce the signal-to-noise ratio of analog-to-digital converter in the fingerprint chip.

Figure 4:
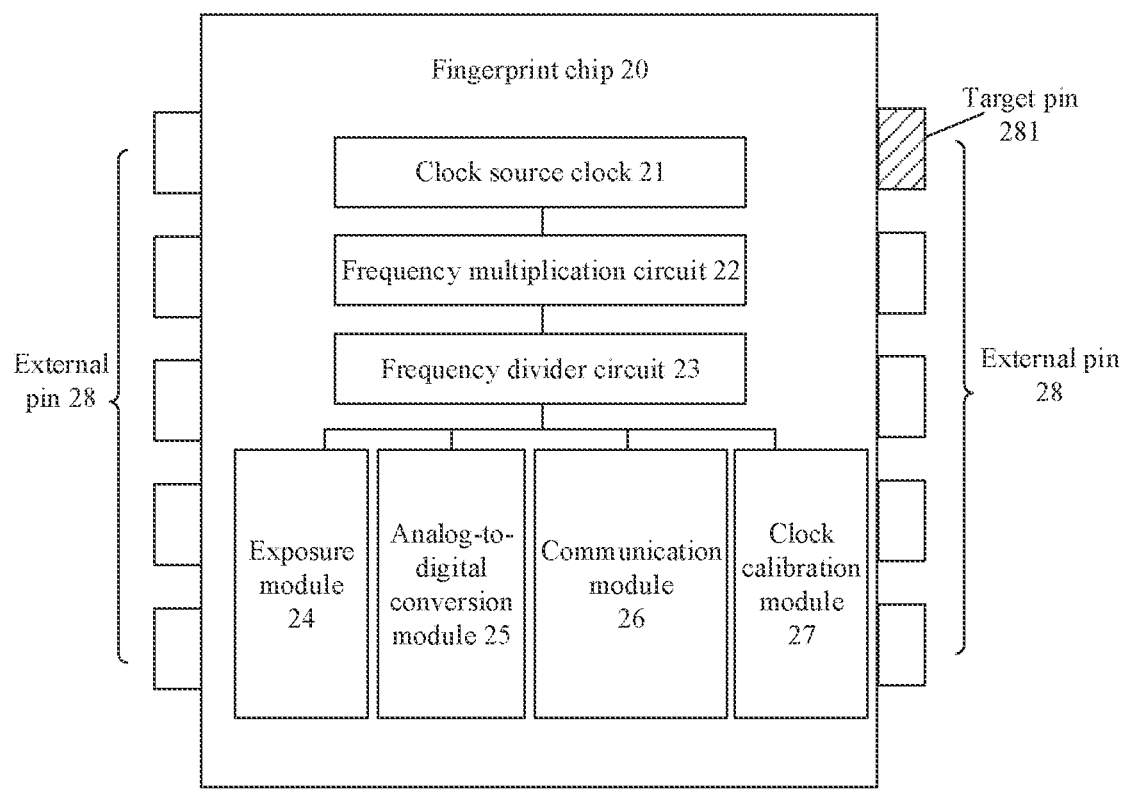
FIG. 4 is a schematic functional block diagram of a fingerprint chip provided according to an embodiment of the present disclosure.

In order to facilitate the description of the fingerprint chip of this embodiment of the present disclosure, FIG. 4 illustrates a schematic functional block diagram of a fingerprint chip 20 provided in an embodiment of the present disclosure.

As shown in FIG. 4, the fingerprint chip 20 may include: a clock source clock 21, a frequency multiplication circuit 22, a frequency divider circuit 23, an exposure module 24, an analog-to-digital conversion module 25, a communication module 26, a clock calibration module 27, and an external pin 28.

Specifically, the clock source circuit 21 may generate a clock F0 with a frequency of q. The clock F0 is processed by the frequency multiplication circuit 22 to form a frequency multiplier clock F with a frequency of m*q, where m is a frequency multiplier multiple, further, the frequency multiplier clock F is processed by the frequency divider circuit 23 to form a variety of clocks, to be provided to the different functional modules in the fingerprint chip, e.g., the frequency of a clock F1 of the exposure module 24 may be F/a, the frequency of a clock F2 of the analog-to-digital conversion module 25 may be F/b, and the frequency of a clock F3 of the communication module 26 may be F/c, where a, b, and c may be the same or different preset constants, which are not limited in the embodiments of the present disclosure.

For the above exposure module 24, the analog-to-digital conversion module 25 and the communication module 26, which are existing functional modules in the fingerprint chip for performing data collection, data processing, and data communication functions of the fingerprint chip, any of the clocks in the clock F1 of the exposure module 24, the clock F2 of the analog-to-digital conversion module 25, and the clock F3 of the communication module 26 may be used as a clock signal for performing clock calibration of the fingerprint chip in the present disclosure.

Alternatively, as shown in FIG. 4, the functional modules of the fingerprint chip 20 may include, in addition to the exposure module 24, the analog-to-digital conversion module 25, and the communication module 26, the clock calibration module 27. The clock calibration module 27 is used to perform the clock calibration function of the fingerprint chip, which may include a clock calibration circuit for adjusting the clock F0 of the clock source circuit 21 so as to adjust the clocks of the functional modules in the fingerprint chip 20. Alternatively, the frequency of a clock F4 of the clock calibration module 27 may be F/d, where d may be any preset constant. The clock F4 of the clock calibration module 27 may also be used as the clock signal for performing clock calibration of the fingerprint chip in the present disclosure.

Specifically, the fingerprint chip 20 includes a plurality of external pins 28, which may include a power pin, a data communication pin, an interrupt pin, a reset pin, or the like. At least one target pin 281 present in the plurality of external pins 28 may be configured to output the clock of any module of the exposure module 24, the analog-to-digital conversion module 25, the communication module 26, and the clock calibration module 27. In other words, the clock of any one of the exposure module 24, the analog-to-digital conversion module 25, the communication module 26, and the clock calibration module 27 may be mapped to the at least one target pin 281, such that the target pin 281 outputs the clock to perform clock calibration of the fingerprint chip. As described in the embodiment shown in FIG. 3 above, the at least one target pin may multiplex the data communication pin or the interrupt pin in the fingerprint chip 20, or may be a newly added independent pin.

It may be understood that FIG. 4 only schematically exemplifies several functional modules in the fingerprint chip, and the clocks of other functional modules in the fingerprint chip in the related art may also be obtained by the clock source circuit 21, the frequency multiplication circuit 22, and the frequency divider circuit 23, and the clocks of the other functional modules may be similarly mapped to the target pin of the fingerprint chip to be used as the current clock of the fingerprint chip in this embodiment of the present disclosure.

Figure 5:
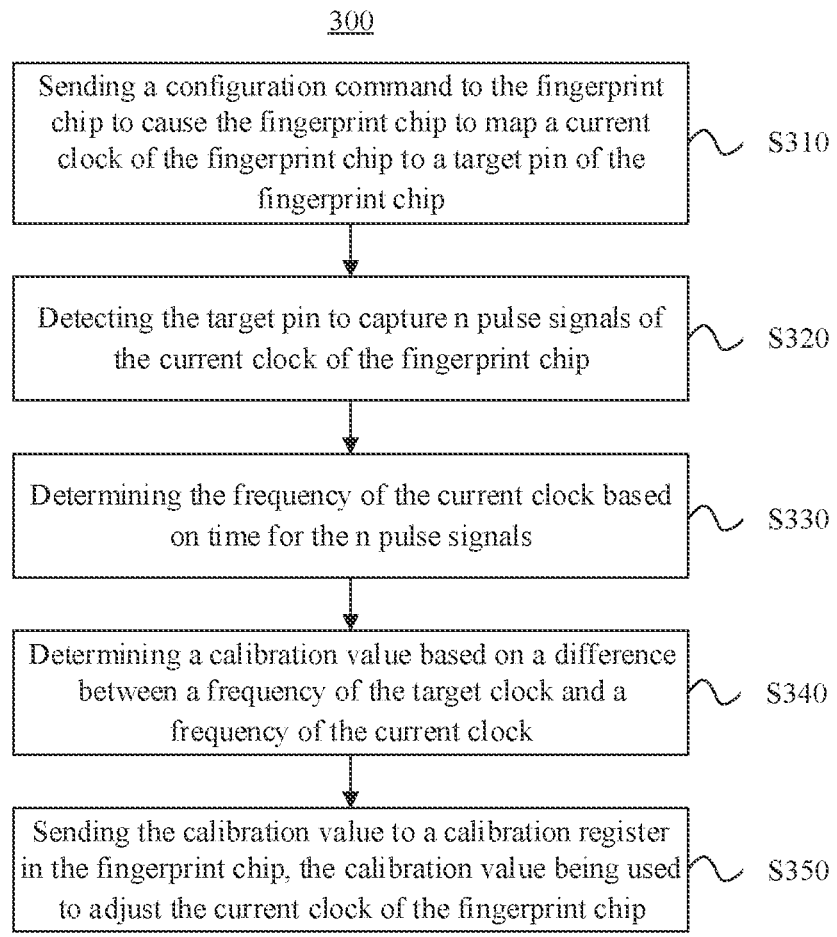
FIG. 5 is a schematic flow block diagram of a clock calibration method of another fingerprint chip provided according to an embodiment of the present disclosure.

FIG. 5 illustrates a schematic flow block diagram of a method 300 for calibrating a clock of another fingerprint chip provided in the present disclosure.

As shown in FIG. 5, the method 300 for calibrating a clock may include the following steps:

S310: sending a configuration command to the fingerprint chip to cause the fingerprint chip to map a current clock of the fingerprint chip to a target pin of the fingerprint chip.

S320: detecting the target pin to capture n pulse signals of the current clock of the fingerprint chip.

S330: determining the frequency of the current clock based on time for the n pulse signals.

S340: determining a calibration value based on a difference between a frequency of the target clock and a frequency of the current clock.

S350: sending the calibration value to a calibration register in the fingerprint chip, the calibration value being used to adjust the current clock of the fingerprint chip.

Specifically, in this embodiment of the present disclosure, a detailed technical solution of the above step S310 and step S350 can be referred to in the relevant descriptions of step S210 and step S240 in FIG. 2 above, detailed description thereof will be omitted.

Alternatively, the above step S320 may be an embodiment of step S220 in FIG. 2 above.

Figure 6:
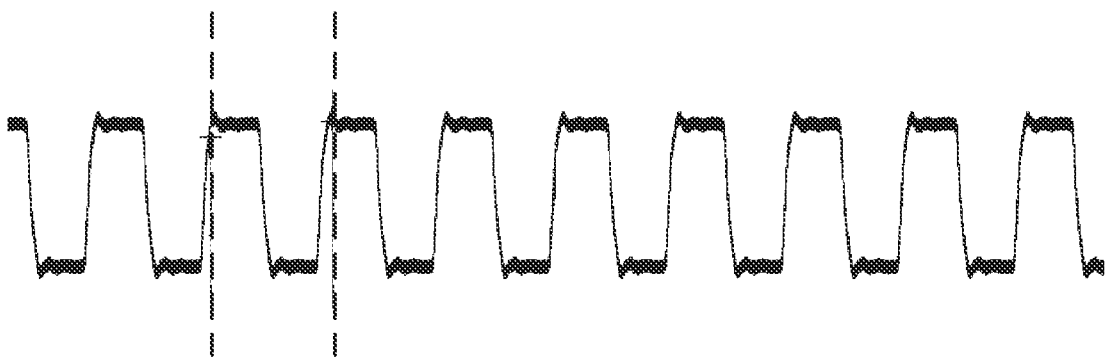
FIG. 6 is a schematic diagram of capturing a rectangular pulse signal based on rising edges of the rectangular pulse signal provided according to an embodiment of the present disclosure.

Specifically, in step S320, detecting the target pin, and the n pulse signals of the current clock of the fingerprint chip may be captured, for example, the n pulse signals of the current clock may be captured by capturing rising edges or falling edges of the pulse signals of the current clock. As an example, FIG. 6 illustrates a schematic diagram of capturing a rectangular pulse signal based on rising edges of the rectangular pulse signal. It may be understood that the rectangular pulse signal in FIG. 6 is only a schematic illustration and should not limit the present disclosure.

In some embodiments, in order to accurately capture the rising edges or falling edges of the n pulse signals of the current clock, it is necessary to sample the current clock based on the more accurate sampling clock having high frequency. Alternatively, the clock frequency of the sampling clock needs to be more than twice the clock frequency of the current clock, to ensure that the captured pulse signals are more accurate. Alternatively, the sampling clock may be a clock in the electronic device in which the fingerprint chip is provided, for example, the CPU clock of the electronic device or the like.

Alternatively, the above step S330 and step S340 may be an embodiment of step S230 in FIG. 2 above.

In some embodiments, after capturing the n pulse signals of the current clock, a time T for the n pulse signals may be determined based on sampling time for the sampling clock, or, in some other embodiments, the capture of the n pulse signals may be determined based on the sampling time T for the sampling clock, which is the time T for the n pulse signals.

Further, a frequency difference $\Delta f$ between the target clock and the current clock may be determined based on a target time T0 for n ideal pulse signals of the target clock and the time T for the n pulse signals of the current clock, and the calibration value may be determined based on the frequency difference $\Delta f$.

Specifically, the frequency of the target clock is $f0=n/T0$, and the frequency of the current clock of the fingerprint chip is $f=n/T$; thus, the difference between the frequency of the target clock and the frequency of the current clock is $\Delta f=n/T0-n/T$. Further, the calibration value may be determined based on positive or negative as well as the absolute value of this $\Delta f$, so as to adjust the current value of the calibration register in the fingerprint chip, so that the frequency of the current clock of the fingerprint chip may be adjusted, such that the adjusted frequency of the fingerprint chip is close to or reaches the target frequency f.

Based on the technical solution of this embodiment of the present disclosure, the n pulse signals of the current clock may be captured using the target pin of the fingerprint chip to determine the frequency of the current clock. Further, based on the difference between the frequency of the current clock and the frequency of the target clock, the calibration value may be determined to adjust the current value of the calibration register in the fingerprint chip, so as to realize the real-time detection and adjustment of the frequency of the current clock, so as to improve the accuracy of the clock of the fingerprint chip and the performance of the fingerprint chip.

In addition, in this embodiment of the present disclosure, an external clock having high accuracy may also be used as the sampling clock for the current clock of the fingerprint chip in this embodiment of the present disclosure, so that a more accurate current clock of the fingerprint chip can be detected, thereby improving the accuracy of clock calibration of the fingerprint chip.

It may be understood that step S320 and step S330 in FIG. 5 only schematically illustrate a method for detecting a clock frequency, and in addition to using step S320 to detect the frequency of the current clock of the fingerprint chip at the target pin, other clock detection methods in the related art may also be used to detect the frequency of the current clock of the fingerprint chip, detailed description thereof will be omitted.

Figures 7, 8:
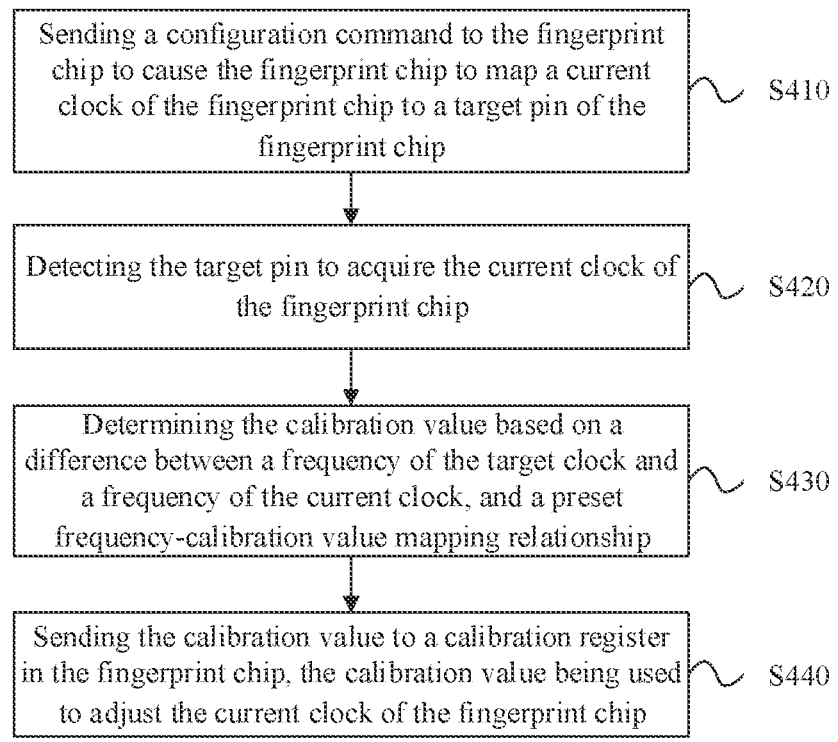
FIG. 7 is a schematic flow block diagram of a clock calibration method of another fingerprint chip provided according to an embodiment of the present disclosure.
FIG. 8 is schematic diagram of a mapping representation of a frequency-calibration value provided according to an embodiment of the present disclosure.

FIG. 7 illustrates a schematic flow block diagram of a method 400 for calibrating a clock of another fingerprint chip provided in the present disclosure.

As shown in FIG. 7, the method 400 for calibrating a clock may include the following steps:

S410: sending a configuration command to the fingerprint chip to cause the fingerprint chip to map a current clock of the fingerprint chip to a target pin of the fingerprint chip.

S420: detecting the target pin to acquire the current clock of the fingerprint chip.

S430: determining the calibration value based on a difference between a frequency of the target clock and a frequency of the current clock, and a preset frequency-calibration value mapping relationship.

S440: sending the calibration value to a calibration register in the fingerprint chip, the calibration value being used to adjust the current clock of the fingerprint chip.

Alternatively, in this embodiment of the present disclosure, steps S410, S420, and step S440 can be referred to in the relevant descriptions of the embodiments above, detailed description thereof will be omitted.

For step S430, it may be an implementation of step S230 in FIG. 2 above or step S340 in FIG. 5.

Specifically, the preset frequency-calibration value mapping relationship may be a frequency-calibration value mapping relationship obtained by determining a large amount of experimental data or simulation data, and the mapping relationship may be in the form of a mapping formula, a mapping table, or a mapping diagram, etc., which may be stored into the fingerprint chip or into a storage unit of the electronic device in which the fingerprint chip is provided.

Alternatively, in this embodiment of the present disclosure, the current value of the calibration register in the fingerprint chip may be acquired, which corresponds to the current clock, then a mapping frequency corresponding to the current value may be determined based on the current value and the preset frequency-calibration value mapping relationship; further, a calibration frequency may be determined based on the difference between the frequency of the target clock and the frequency of the current clock and the above mapping frequency; and finally, the calibration value corresponding to the calibration frequency may be determined based on the calibration frequency and the preset frequency-calibration value mapping relationship.

As an example, as shown in FIG. 8, the frequency-calibration value mapping relationship in this embodiment of the present disclosure may be a mapping table of frequency-calibration values. For example, when the current value of the calibration register in the fingerprint chip is c5 in FIG. 8, the mapping frequency corresponding to this current value c5 in the mapping table is f5. Then, based on the difference $\Delta f$ between the frequency of the target clock and the frequency of the current clock, and the mapping frequency f5, the frequency f may be obtained, where $f=f5+\Delta f$, $\Delta f$ may be positive or negative.

Further, in the mapping table, a frequency closest to the frequency f may be determined as the calibration frequency, for example, in the mapping table, the frequency closest to f is f3, then the frequency 3 is the calibration frequency, and based on the calibration frequency B and the mapping table, the calibration value corresponding to the calibration frequency B is determined to be c3. The calibration value c3 is used to be sent to the calibration register in the fingerprint chip and is used to adjust the current clock of the fingerprint chip.

Based on the technical solution of this embodiment of the present disclosure, the calibration value may be determined quickly and relatively accurately by using the preset frequency-calibration value mapping relationship, thereby improving a clock calibration speed for the fingerprint chip.

Figure 9:
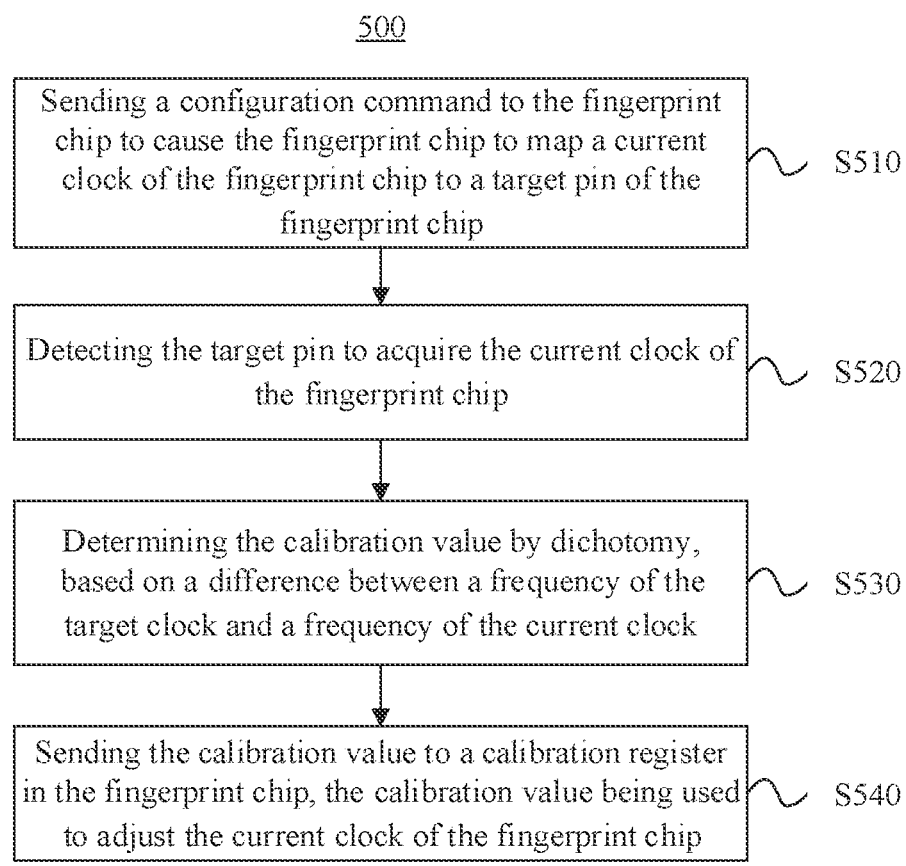
FIG. 9 is a schematic flow block diagram of a clock calibration method of another fingerprint chip provided according to an embodiment of the present disclosure.

FIG. 9 illustrates a schematic flow block diagram of a method 500 for calibrating a clock of another fingerprint chip provided in the present disclosure.

As shown in FIG. 9, the method 500 for calibrating a clock may include the following steps:

S510: sending a configuration command to the fingerprint chip to cause the fingerprint chip to map a current clock of the fingerprint chip to a target pin of the fingerprint chip.

S520: detecting the target pin to acquire the current clock of the fingerprint chip.

S530: determining the calibration value by dichotomy, based on a difference between a frequency of the target clock and a frequency of the current clock.

S540: sending the calibration value to a calibration register in the fingerprint chip, the calibration value being used to adjust the current clock of the fingerprint chip.

Alternatively, in this embodiment of the present disclosure, steps S510, S520, and step S540 can be referred to in the relevant descriptions of the embodiments above, detailed description thereof will be omitted.

For step S530, it may be an implementation of step S230 in FIG. 2 above or step S340 in FIG. 5.

Specifically, in this embodiment of the present disclosure, values can be stored in the calibration register have a preset range, for example, a storable maximum value in the calibration register is Cmax and a storable minimum value is Cmin. Based on the idea of dichotomy, it may be assumed that the calibration value in the calibration register has a linear functional relationship with the clock frequency, and the clock frequency increases monotonically with the calibration value.

After determining the difference $\Delta f$ between the frequency of the target clock and the frequency of the current clock, the current value C in the calibration register corresponding to the current clock may be acquired, and when $\Delta f$ is positive, the calibration value C' may be determined based on the current value C and a first formula, where the first formula is: $C'=C+\lceil (C_{max}-C)/2 \rceil$, and the symbol $\lceil\ \rceil$ indicates upward rounding. when $\Delta f$ is negative, the calibration value C' may be determined based on the current value C and a second formula, where the second formula is $C'=C+\lceil (C-C_{min})/2 \rceil$. Further, the calibration value C' determined by the current value C and the formulas is used to be sent to the calibration register in the fingerprint chip and is used to adjust the current clock of the fingerprint chip.

Based on the technical solution of this embodiment of the present disclosure, the calibration value of the fingerprint chip is determined by dichotomy, the clock calibration process of the fingerprint chip may be performed without the need for the preset frequency-calibration value mapping relationship, therefore, storage of the preset frequency-calibration value mapping relationship may be avoided to save storage space. In addition, the dichotomy is simple and fast to implement, and the clock calibration of the fingerprint chip may also be realized efficiently.

Figure 10:
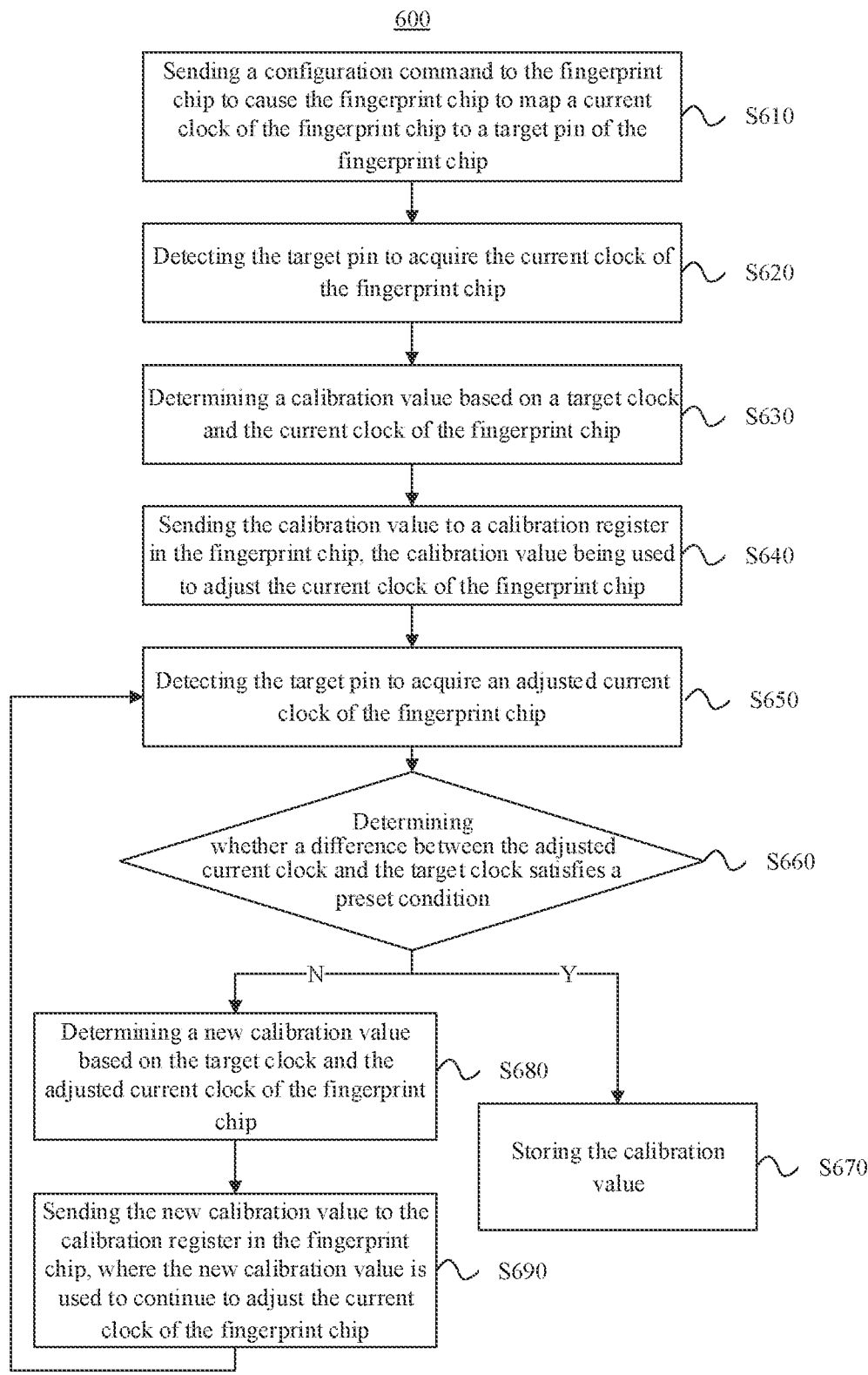
FIG. 10 is a schematic flow block diagram of a clock calibration method of another fingerprint chip provided according to an embodiment of the present disclosure.

The process of how to adjust the clock of the fingerprint chip provided in the electronic device is illustrated above in conjunction with the embodiments shown in FIGS. 3 to 9, and on the basis of the embodiments shown in FIG. 3 to FIG. 9 above, FIG. 10 illustrates a schematic flow block diagram of a method 600 for calibrating a clock of another fingerprint chip provided according to an embodiment of the present disclosure.

As shown in FIG. 10, the method 600 for calibrating a clock may include the following steps:

S610: sending a configuration command to the fingerprint chip to cause the fingerprint chip to map a current clock of the fingerprint chip to a target pin of the fingerprint chip.

S620: detecting the target pin to acquire the current clock of the fingerprint chip.

S630: determining a calibration value based on a target clock and the current clock of the fingerprint chip.

S640: sending the calibration value to a calibration register in the fingerprint chip, the calibration value being used to adjust the current clock of the fingerprint chip.

S650: detecting the target pin to acquire an adjusted current clock of the fingerprint chip.

S660: determining whether a difference between the adjusted current clock and the target clock satisfies a preset condition.

S670: if yes, storing the calibration value.

S680: if no, determining a new calibration value based on the target clock and the adjusted current clock of the fingerprint chip; and S690: sending the new calibration value to the calibration register in the fingerprint chip, where the new calibration value is used to continue to adjust the current clock of the fingerprint chip.

Alternatively, in this embodiment of the present disclosure, step S610 to step S640 can be referred to in the relevant descriptions of the embodiments shown in FIG. 3 to FIG. 9.

On the basis of the embodiments shown in FIG. 3 to FIG. 9, the method 600 for calibrating a clock provided in this embodiment of the present disclosure further includes step 650 to step 670, in step S650, the target pin is re-detected, and the current clock acquired in this regard is the clock of the fingerprint chip after being adjusted through the preceding step, i.e., the current clock of the fingerprint chip detected then is different from the current clock detected in step S620. Further, in step S660, it may be determined whether the difference between the adjusted current clock of the fingerprint chip and the target clock satisfies the preset condition, for example, it may be determined whether an absolute value of a difference between a period of the adjusted current clock and a period of the target clock is less than or equal to a preset threshold.

Alternatively, in some embodiments, the preset threshold is greater than or equal to 0, and less than or equal to exposure time for a row of pixels in the fingerprint chip. It should be noted that pixels in the fingerprint chip are arranged in an array, and the array of pixels is not exposed at the same time to form a fingerprint image, but is exposed in a rolling shutter method to form the fingerprint image. In this embodiment of the present disclosure, when the absolute value of the difference between the period of the adjusted current clock and the period of the target clock is less than or equal to the exposure time for a row of pixels in the fingerprint chip, then it may be considered that the difference between the adjusted current clock of the fingerprint chip and the target clock satisfies the preset condition.

Alternatively, in some embodiments, the preset threshold is greater than or equal to 0, and less than or equal to unit adjustable time for the calibration register. It should be noted that in the clock calibration process, one of a plurality of consecutive values may be stored into the calibration register at a time, and a difference between clock periods of the fingerprint chip corresponding to two adjacent values in the plurality of consecutive values is the unit adjustable time for the calibration register. In this embodiment of the present disclosure, when the absolute value of the difference between the period of the adjusted current clock and the period of the target clock is less than or equal to the unit adjustable time for the calibration register, then it may be considered that the difference between the adjusted current clock of the fingerprint chip and the target clock satisfies the preset condition.

In this embodiment, the unit adjustable time for the calibration register is generally less than the exposure time for a row of pixels in the fingerprint chip, i.e., in this embodiment, the adjusted current clock may be closer to the target clock, and the clock calibration is more accurate.

It may be understood that the preset threshold in this embodiment of the present disclosure may be set to any value between the unit adjustable time for the calibration register and the exposure time for a row of pixels in the fingerprint chip based on actual application requirements, which is not limited in an embodiment of the present disclosure.

When the difference between the adjusted current clock and the target clock satisfies the preset condition, for example, the absolute value of the difference between the period of the adjusted current clock and the period of the target clock is less than or equal to the preset threshold, then it indicates that the adjusted current clock is close to or reaches the target clock, step S670 may be performed in this regard, that is, storing the calibration value into the calibration register, and during subsequent operation of the fingerprint chip, a more accurate clock may be generated based on this calibration value.

Alternatively, in some embodiments, the calibration value may be stored into the storage unit of the electronic device in which the fingerprint chip is provided, and the use of this embodiment may save storage space in the fingerprint chip.

Alternatively, in some other embodiments, a storage instruction may be sent to the fingerprint chip to enable the fingerprint chip to store the calibration value into its own storage unit. The use of this embodiment may avoid the electronic device in which the fingerprint chip is provided from malfunctioning. when relevant parameters of the fingerprint chip are lost after repairing, it is not necessary to re-execute the clock calibration function of the fingerprint chip, the fingerprint chip may generate a more accurate clock directly based on the calibration value stored therein, which is conducive to improving the performance of the fingerprint chip and enhancing user experience.

When the difference between the adjusted current clock and the target clock does not satisfy the preset condition, for example, the absolute value of the difference between the period of the adjusted current clock and the period of the target clock is greater than the preset threshold, then it indicates that it is necessary to continue to adjust the current clock of the fingerprint chip. In this regard, step S680 and step S690 may be performed, based on the target clock and the adjusted current clock of the fingerprint chip, the new calibration value may be determined, and the new calibration value is sent to the calibration register in the fingerprint chip. The new calibration value is used to continue to adjust the current clock of the fingerprint chip, until the difference between the adjusted current clock and the target clock satisfies the preset condition.

Alternatively, step S680 is performed in the same way as step S630, and step S690 is performed in the same way as step 640, the difference is only that the current clock of the fingerprint chip is changed in step S680 and step S690 with respect to step S630 and step S640, and correspondingly, the calibration value determined based on this current clock and the target clock has changed.

Further, in this embodiment of the present disclosure, step S650 to step S690 may be performed repeatedly to continuously and dynamically adjust the current clock of the fingerprint chip, until the clock of the fingerprint chip is made close to or reaches the target clock.

Based on the technical solution of this embodiment of the present disclosure, it may realize dynamic and continuous adjustment to the clock of the fingerprint chip, and after the clock of the fingerprint chip satisfies the preset condition, the corresponding calibration value thereof is stored, so as to facilitate the fingerprint chip to generate a more accurate clock directly based on the stored calibration value during the subsequent operation, thereby improving the performance of the fingerprint chip during the subsequent operation.

In the embodiments shown in FIG. 3 to FIG. 10 above, the executing body of the methods 200 to 600 for calibrating a clock may be the processor of the electronic device in which the fingerprint chip is provided. Corresponding to the above method 200 for calibrating a clock, FIG. 11 illustrates a schematic flow block diagram of another method 700 for calibrating a clock, the executing body of which may be a fingerprint chip.

Figure 11:
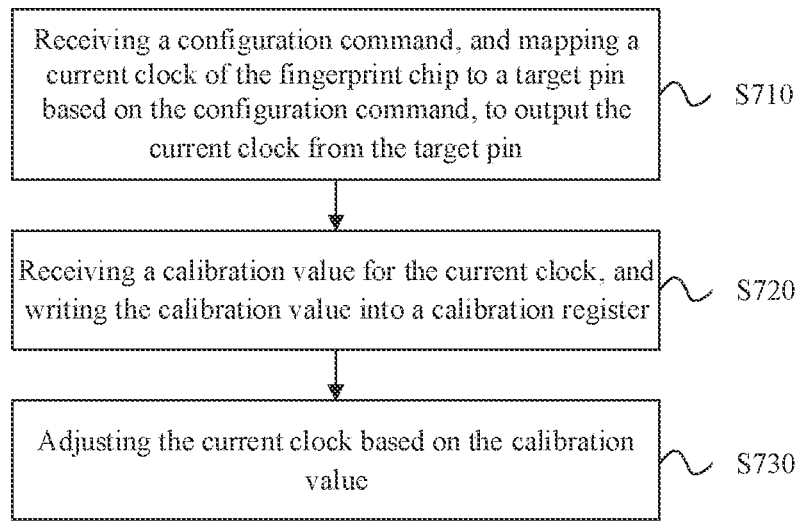
FIG. 11 is a schematic flow block diagram of a clock calibration method of another fingerprint chip provided according to an embodiment of the present disclosure.

As shown in FIG. 11, the method 700 for calibrating a clock may include the following steps:
- S710: receiving a configuration command, mapping a current clock of the fingerprint chip to a target pin based on the configuration command, to output the current clock from the target pin.
- S720: receiving a calibration value for the current clock, and writing the calibration value into a calibration register.
- S730: adjusting the current clock based on the calibration value.

Alternatively, in this embodiment of the present disclosure, the fingerprint chip may receive the configuration command sent by the processor of the electronic device in which the chip is provided, and map its current clock to the target pin based on the configuration command, so that the current clock is output from the target pin.

Further, the processor of the electronic device may perform step S220 to step S240 in the method 200 for calibrating a clock, so as to send the calibration value determined based on the target clock and the current clock of the fingerprint chip to the fingerprint chip. The fingerprint chip performs the above step S720 and step S730, receives the calibration value, and adjusts the current clock based on the calibration value.

Alternatively, in this embodiment of the present disclosure, a communication pin of the fingerprint chip may be multiplexed as the target pin.

As an example, a serial peripheral interface SPI pin or a general-purpose input/output GPIO pin of the fingerprint chip may be multiplexed as the target pin.

Alternatively, the current clock of the fingerprint chip includes any of: a clock source clock, a clock of an exposure module, a clock of an analog-to-digital conversion module, a clock of a communication module and a clock of a clock calibration module.

It may be understood that the method 700 for calibrating a clock provided in this embodiment of the present disclosure corresponds to the above method 200 for calibrating a clock, and relevant technical features thereof can be referred to in FIG. 2 as well as in the specific description of the relevant embodiment, detailed description thereof will be omitted.

Based on the technical solution of this embodiment of the present disclosure, a clock calibration method applied to a fingerprint chip is provided, i.e., a clock calibration method, applied to a packaged fingerprint chip, after a fingerprint die has been packaged, e.g., it is possible that the fingerprint chip and the electronic device interact with each other for clock calibration when the fingerprint chip is assembled in the electronic device, or, alternatively, it is possible that the fingerprint chip and the electronic device interact with each other for clock calibration during use of the electronic device by a user. Specifically, in the technical solution of this embodiment of the present disclosure, the fingerprint chip may receive a configuration command and map its clock to a target pin based on the configuration command, and output the clock from the target pin for external testing, facilitating real-time adjustment to the obtained clock for this test, thus improving the accuracy of the clock of the fingerprint chip and improving the performance of the fingerprint chip. Specifically, improving the accuracy of the clock, may avoid inaccuracy of the clock affecting the exposure time for the fingerprint chip, so as to avoid a fingerprint image collected by the fingerprint chip from showing horizontal stripes and affecting the performance of fingerprint detection; improving the accuracy of the clock, may also avoid affecting the data communication between the fingerprint chip and the external; and improving the accuracy of the clock, may also reduce the signal-to-noise ratio of analog-to-digital converter.

Figure 12:
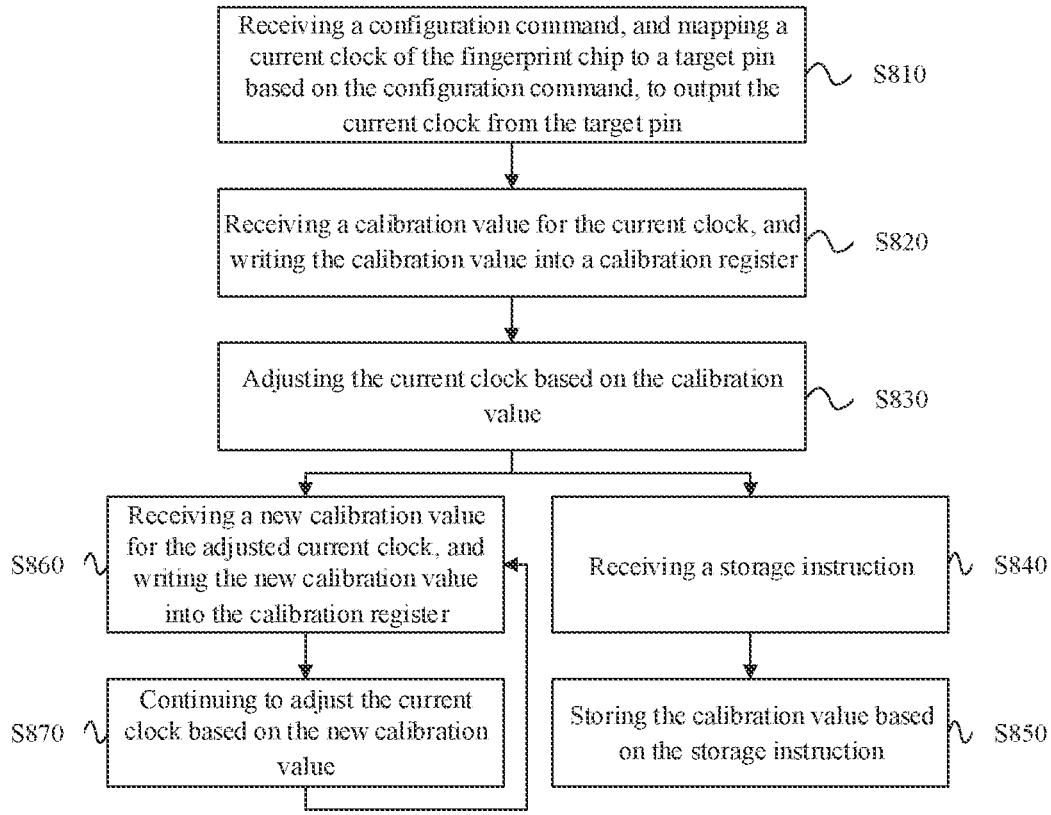
FIG. 12 is a schematic flow block diagram of a clock calibration method of another fingerprint chip provided according to an embodiment of the present disclosure.

Based on the method 700 for calibrating a clock shown in FIG. 11, FIG. 12 illustrates a schematic flow block diagram of another method 800 for calibrating a clock.

As shown in FIG. 12, the method 800 for calibrating a clock may include the following steps:
- S810: receiving a configuration command, mapping a current clock of the fingerprint chip to a target pin based on the configuration command, to output the current clock from the target pin.
- S820: receiving a calibration value for the current clock, and writing the calibration value into a calibration register.
- S830: adjusting the current clock based on the calibration value.
- S840: receiving a storage instruction.
- S850: storing the calibration value based on the storage instruction.
- S860: receiving a new calibration value for the adjusted current clock, and writing the new calibration value into the calibration register.
- S870: continuing to adjust the current clock based on the new calibration value.

Specifically, in this embodiment of the present disclosure, step S810 to step S830 can be referred to in step S710 to step S730 described in FIG. 7 above.

Alternatively, on this basis, in step S840 and step S850, the fingerprint chip also receives the storage instruction, which is used to indicate that the difference between the adjusted current clock of the fingerprint chip and the target clock satisfies the preset condition, that is, in this regard, the adjusted current clock of the fingerprint chip is close to or reaches the target clock. The fingerprint chip stores the current calibration value into the calibration register based on the storage instruction, and during the subsequent operation of the fingerprint chip, a more accurate clock may be generated directly based on the stored calibration value.

Alternatively, in step S860 and step S870, the fingerprint chip further receives the new calibration value for the adjusted current clock, writes the new calibration value into the calibration register, and continues to adjust the current clock based on the new calibration value until the fingerprint chip receives the storage instruction.

It should be noted that step S860 is performed in the same way as step S820, and step S870 is performed in the same way as step S830, the difference is only that the current clock of the fingerprint chip is changed in step S860 and step S870 with respect to step S820 and step S830, and correspondingly, the received calibration value for this current clock has changed.

Further, in this embodiment of the present disclosure, step S860 and step S870 may be performed repeatedly to dynamically adjust the current clock of the fingerprint chip, until the fingerprint chip receives the storage instruction, indicating that the final adjusted current clock is close to or reaches the target clock.

Based on the technical solution of this embodiment of the present disclosure, it may realize dynamic and continuous adjustment to the clock of the fingerprint chip, and after the clock of the fingerprint chip satisfies the preset condition, the corresponding calibration value thereof is stored, so as to facilitate the fingerprint chip to generate a more accurate clock directly based on the stored calibration value during the subsequent operation, thereby improving the performance of the fingerprint chip during the subsequent operation.

The method embodiments of the present disclosure are described in detail above, in conjunction with FIGS. 3 to 12, apparatus embodiments of the present disclosure will be described below, in conjunction with FIG. 13 and FIG. 14. With the apparatus embodiments and the method embodiments corresponding to each other, parts not described in detail can be referred to in previous parts of the method embodiments.

Figure 13:
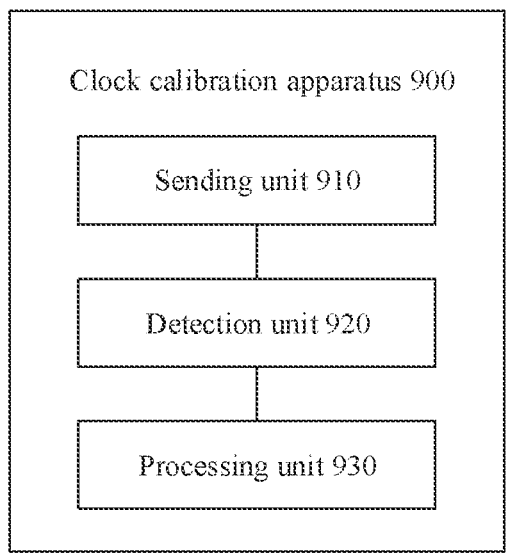
FIG. 13 is a schematic function block diagram of a clock calibration apparatus provided according to an embodiment of the present disclosure.

FIG. 13 illustrates a schematic function block diagram of an apparatus 900 for calibrating a clock. The apparatus 900 for calibrating a clock is used for calibrating a clock of a fingerprint chip provided in an electronic device.

As shown in FIG. 13, the apparatus 900 for calibrating a clock includes:
- a sending unit 910, configured to send a configuration command to the fingerprint chip to cause the fingerprint chip to map a current clock of the fingerprint chip to a target pin of the fingerprint chip;
- a detection unit 920, configured to detect the target pin to acquire the current clock of the fingerprint chip;
- a processing unit 930, configured to determine a calibration value based on a target clock and the current clock of the fingerprint chip; and
- the sending unit 910, further configured to send the calibration value to a calibration register in the fingerprint chip, the calibration value being used to adjust the current clock of the fingerprint chip.

In some possible embodiments, a communication pin of the fingerprint chip is multiplexed as the target pin of the fingerprint chip.

In some possible embodiments, the communication pin of the fingerprint chip is a serial peripheral interface SPI pin or a general-purpose input/output GPIO pin.

In some possible embodiments, the current clock of the fingerprint chip includes any of: a clock source clock, a clock of an exposure module, a clock of an analog-to-digital conversion module, a clock of a communication module and a clock of a clock calibration module.

In some possible embodiments, the processing unit 930 is configured to: determine the calibration value by dichotomy, based on a difference between a frequency of the target clock and a frequency of the current clock.

In some possible embodiments, the processing unit 930 is configured to: acquire a current value of the calibration register in the fingerprint chip;
when the difference between the frequency of the target clock and the frequency of the current clock is positive, determine the calibration value based on the current value and a first formula, the first formula being:

$$C'=C+[(C_{max}-C)/2]; \text{ or}$$

when the difference between the frequency of the target clock and the frequency of the current clock is negative, determine the calibration value based on the current value and a second formula, the second formula being:

$$C'=C+[(C-C_{min})/2];$$

where C' is the calibration value, C is the current value, and Cmin and Cmax are respectively a minimum value and a maximum value that can be stored into the calibration register.

In some possible embodiments, the processing unit 930 is configured to: determine the calibration value based on a difference between a frequency of the target clock and a frequency of the current clock, and a preset frequency-calibration value mapping relationship; where the mapping relationship includes: a mapping formula, a mapping table or a mapping diagram.

In some possible embodiments, the processing unit 930 is configured to: determine, based on a current value of the calibration register in the fingerprint chip and the mapping relationship, a mapping frequency corresponding to the current value; determine a calibration frequency, based on the difference between the frequency of the target clock and the frequency of the current clock and the mapping frequency; and determine the calibration value corresponding to the calibration frequency, based on the calibration frequency and the mapping relationship.

In some possible embodiments, the preset frequency-calibration value mapping relationship is a frequency-calibration value mapping relationship obtained by determining experimental data or simulation data.

In some possible embodiments, the detection unit 920 is configured to: detect the target pin to capture n pulse signals of the current clock of the fingerprint chip, where n is a positive integer; the processing unit 930 is configured to: determine the frequency of the current clock based on time for the n pulse signals; and determine the calibration value based on the difference between the frequency of the target clock and the frequency of the current clock.

In some possible embodiments, the detection unit 920 is configured to: acquire a sampling clock; detect the target pin based on the sampling clock, capture n rising edges or falling edges of the current clock of the fingerprint chip to capture the n pulse signals of the current clock; where, a frequency of the sampling clock is more than twice the frequency of the current clock of the fingerprint chip.

In some possible embodiments, the sampling clock is a clock in the electronic device.

In some possible embodiments, when a difference between the adjusted current clock of the fingerprint chip and the target clock satisfies a preset condition, the calibration value is used for storing in a storage unit.

In some possible embodiments, the calibration value is used for storing in the storage unit of the fingerprint chip.

In some possible embodiments, when the difference between the adjusted current clock of the fingerprint chip and the target clock does not satisfy a preset condition, the processing unit 930 is further configured to determine a new calibration value based on the target clock and the adjusted current clock of the fingerprint chip; and the sending unit 910 is further configured to send the new calibration value to the calibration register in the fingerprint chip, where the new calibration value is used to continue to adjust the current clock of the fingerprint chip.

In some possible embodiments, the apparatus 900 for calibrating a clock is provided in a processor of the electronic device.

Figure 14:
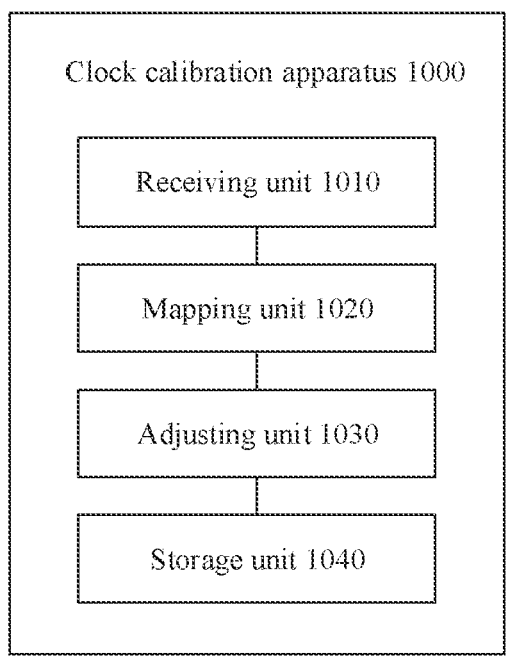
FIG. 14 is a schematic function block diagram of another clock calibration apparatus provided according to an embodiment of the present disclosure.

FIG. 14 illustrates a schematic function block diagram of an apparatus 1000 for calibrating a clock. The apparatus 1000 for calibrating a clock is provided in a fingerprint chip in an electronic device.

As shown in FIG. 14, the apparatus 1000 for calibrating a clock includes:

a receiving unit 1010, configured to receive a configuration command;

a mapping unit 1020, configured to map a current clock of the fingerprint chip to a target pin based on the configuration command, to output the current clock from the target pin;

the receiving unit 1010, further configured to receive a calibration value for the current clock, and write the calibration value into a calibration register; and an adjusting unit 1030, configured to adjust the current clock based on the calibration value.

In some possible embodiments, a communication pin of the fingerprint chip is multiplexed as the target pin.

In some possible embodiments, a serial peripheral interface SPI pin or a general-purpose input/output GPIO pin of the fingerprint chip is multiplexed as the target pin.

In some possible embodiments, the current clock of the fingerprint chip includes any of: a clock source clock, a clock of an exposure module, a clock of an analog-to-digital conversion module, a clock of a communication module and a clock of a clock calibration module.

In some possible embodiments, the receiving unit 1010 is further configured to: receive a storage instruction; and as shown in FIG. 14, the apparatus 1000 for calibrating a clock further includes: a storage unit 1040, configured to store the calibration value based on the storage instruction, where the storage instruction is used to indicate that the difference between the adjusted current clock and the target clock satisfies a preset condition.

In some possible embodiments, the receiving unit 1010 is further configured to: receive a new calibration value for the adjusted current clock, and write the new calibration value into the calibration register; and the adjusting unit 1030, further configured to continue to adjust the current clock based on the new calibration value.

In some possible embodiments, the configuration command and the calibration value received by the receiving unit 1010 are sent by a processor of the electronic device.

An embodiment of the present disclosure also provides an electronic device, including: a processor and a fingerprint chip, where the processor may include the apparatus 900 for calibrating a clock, and/or, the fingerprint chip may include the apparatus 1000 for calibrating a clock.

In addition, an embodiment of the present disclosure also provides a clock calibration apparatus, including: a memory and a processor; where the memory is used for storing a computer program, the processor is used for calling the computer program, the computer program, when executed by the processor, cause the clock calibration apparatus to perform the method of any one of the above method embodiments.

An embodiment of the present disclosure also provides a computer readable storage medium, storing a computer program thereon, the computer program, when executed by a computer, cause the computer to perform the method of any one of the above method embodiments.

An embodiment of the present disclosure also provides a computer program product including instructions, the instructions, when executed by a computer, cause the computer to perform the method of any one of the above method embodiments.

It should be understood that the processor or processing unit in embodiments of the present disclosure may be an integrated circuit chip having signal processing capabilities. In realization, the steps of the above method embodiments may be accomplished by integrated logic circuits of hardware in the processor or by instructions in the form of software. The above processor may be a general-purpose processor, a Digital Signal Processor (DSP), an Application Specific Integrated Circuit (ASIC), a Field Programmable Gate Array (FPGA), or other programmable logic devices, discrete gate or transistor logic devices, and discrete hardware components. Various methods, steps, and logic block diagrams of the disclosure in the embodiments of the present disclosure may be implemented or performed. The general-purpose processor may be a microprocessor or the processor may also be any conventional processor, etc. The steps of the methods disclosed in conjunction with embodiments of the present disclosure may be directly embodied as being performed by a hardware decoding processor, or performed with a combination of hardware and software modules in a decoding processor. The software module may be located in random memory, flash memory, read-only memory, programmable read-only memory or electrically erasable programmable memory, registers, and other storage mediums well established in the art. The storage medium is located in a memory, and the processor reads the information in the memory and completes the steps of the methods described above in conjunction with its hardware.

The memory or storage unit in embodiments of the present disclosure may be volatile memory or non-volatile memory, or may include both volatile and non-volatile memory. Among other things, the non-volatile memory may be Read-Only Memory (ROM), Programmable ROM (PROM), Erasable Programmable Read-Only Memory (EPROM), Electrically Erasable Programmable Read-Only Memory (EEPROM), or Flash memory. The volatile memory may be Random Access Memory (RAM), which is used as an external cache. By way of illustration, but not limitation, many forms of RAM are available, such as Static RAM (SRAM), Dynamic RAM (DRAM), Synchronous DRAM (SDRAM), Double Data Rate SDRAM (DDR SDRAM), Enhanced SDRAM (ESDRAM), SynchLink DRAM (SLDRAM), and Direct Rambus Random Access Memory (DRAM). It should be noted that the memory of the systems and methods described herein is intended to include, but is not limited to, these and any other suitable types of memory.

Those of ordinary skill in the art may realize that the units and algorithmic steps of the various examples described in conjunction with the embodiments disclosed herein are capable of being implemented in electronic hardware, or a combination of computer software and electronic hardware. Whether these functions are performed in hardware or software depends on the particular application and design constraints of the technical solution. Those skilled in the art may use different methods to implement the described functions for each particular application, but such implementations should not be considered outside the scope of the present disclosure.

It may be clearly understood by those skilled in the art that, for the convenience and brevity of the description, specific working processes of the systems, apparatuses, and units described above can be referred to in the corresponding processes of the preceding method embodiments, detailed description thereof will be omitted.

In several embodiments provided in the present disclosure, it should be understood that the systems, apparatuses and methods disclosed, may be realized in other ways. For example, the apparatus embodiments described above are merely schematic, e.g., the division of the units described, is merely a logic functional division, and in actual implementation it may be divided in other ways, e.g., multiple units or components may be combined or may be integrated into another system, or some features may be ignored, or not implemented. In addition, mutual coupling or direct coupling or communication connection shown or discussed may be an indirect coupling or communication connection through some interface, apparatus or unit, which may be electrical, mechanical or otherwise.

The units illustrated as separated components may or may not be physically separated, and components displayed as units may or may not be physical units, i.e., they may be located in one place, or they may be distributed to a plurality of network units. Some or all of these units may be selected to fulfill the purpose of this embodiment scheme based on actual needs.

In addition, each functional unit in various embodiments of the present disclosure may be integrated in one processing unit, or each unit may physically exist separately, or two or more units may be integrated in one unit.

The functionality may be stored in a computer readable storage medium if it is realized in the form of a software functional unit and sold or used as a separate product. Based on this understanding, the technical solution of the present disclosure essentially or contributing to the prior art or part of the technical solution may be embodied in the form of a software product, the computer software product is stored in a storage medium including a number of instructions to cause a computer device (which may be a personal computer, a server, or a network device, etc.) to perform all or part of the steps of the methods described in the various embodiments of the present disclosure. The aforementioned storage medium includes: USB flash drives, removable hard disks, read-only memory (ROM), random access memory (RAM), disks or CD-ROMs, and other kinds of medium that can store program code.

The above mentioned are only specific embodiments of the present disclosure, but the scope of protection of the present disclosure is not limited thereto. Those skilled in the art who can readily think of variations or substitutions within the scope of the technology disclosed in the present disclosure shall be covered by the scope of protection of the present disclosure. Therefore, the scope of protection of the present disclosure shall be stated to be subject to the scope of protection of the claims.

What is claimed is:

1. A clock calibration method, for calibrating a clock of a fingerprint chip provided in an electronic device, comprising:
   sending a configuration command to the fingerprint chip to cause the fingerprint chip to map a current clock of the fingerprint chip to a target pin of the fingerprint chip;
   detecting the target pin to acquire the current clock of the fingerprint chip;
   determining a calibration value based on a target clock and the current clock of the fingerprint chip; and
   sending the calibration value to a calibration register in the fingerprint chip, the calibration value being used to adjust the current clock of the fingerprint chip;
   wherein the detecting the target pin to acquire the current clock of the fingerprint chip, comprises:
      detecting the target pin to capture n pulse signals of the current clock of the fingerprint chip, wherein n is a positive integer;
   the determining a calibration value based on a target clock and the current clock of the fingerprint chip, comprises:
      determining the frequency of the current clock based on time for the n pulse signals; and
      determining the calibration value based on the difference between the frequency of the target clock and the frequency of the current clock;
   wherein the detecting the target pin to capture n pulse signals of the current clock of the fingerprint chip, comprises:
      acquiring a sampling clock, wherein the sampling clock is a clock in the electronic device;
      detecting the target pin based on the sampling clock, capturing n rising edges or falling edges of the current clock of the fingerprint chip to capture the n pulse signals of the current clock;
      wherein a frequency of the sampling clock is more than twice the frequency of the current clock of the fingerprint chip.

2. The clock calibration method according to claim 1, wherein a communication pin of the fingerprint chip is multiplexed as the target pin of the fingerprint chip, and the communication pin of the fingerprint chip is a serial peripheral interface SPI pin or a general-purpose input/output GPIO pin, and
   wherein the current clock of the fingerprint chip comprises any of: a clock source clock, a clock of an exposure module, a clock of an analog-to-digital conversion module, a clock of a communication module and a clock of a clock calibration module.

3. The clock calibration method according to claim 1, wherein the determining a calibration value based on a target clock and the current clock of the fingerprint chip, comprises:
   determining the calibration value by dichotomy based on a difference between a frequency of the target clock and a frequency of the current clock.

4. The clock calibration method according to claim 3, wherein the determining the calibration value by dichotomy based on a difference between a frequency of the target clock and a frequency of the current clock, comprises:
   acquiring a current value of the calibration register in the fingerprint chip;
   determining the calibration value based on the current value and a first formula when the difference between the frequency of the target clock and the frequency of the current clock is positive, the first formula being:

$$C'=C+[(C_{max}-C)/2]; \text{ or}$$

determining the calibration value based on the current value and a second formula when the difference between the frequency of the target clock and the frequency of the current clock is negative, the second formula being:

$$C'=C+[(C-C_{min})/2];$$

wherein C' is the calibration value, C is the current value, and $C_{min}$ and $C_{max}$ are respectively a minimum value and a maximum value that can be stored into the calibration register.

5. The clock calibration method according to claim 1, wherein the determining a calibration value based on a target clock and the current clock of the fingerprint chip, comprises:
   determining the calibration value based on a difference between a frequency of the target clock and a frequency of the current clock, and a preset frequency-calibration value mapping relationship;
   wherein the mapping relationship comprises: a mapping formula, a mapping table or a mapping diagram.

6. The clock calibration method according to claim 5, wherein the determining the calibration value based on a difference between a frequency of the target clock and a frequency of the current clock, and a preset frequency-calibration value mapping relationship, comprises:
   determining a mapping frequency corresponding to the current value based on a current value of the calibration register in the fingerprint chip and the mapping relationship;
   determining a calibration frequency based on the difference between the frequency of the target clock and the frequency of the current clock and the mapping frequency; and
   determining the calibration value corresponding to the calibration frequency, based on the calibration frequency and the mapping relationship.

7. The clock calibration method according to claim 1, wherein the clock calibration method further comprises:
   storing the calibration value when an absolute value of a difference between a period of the adjusted current clock of the fingerprint chip and a period of the target clock is less than or equal to a preset threshold,
   wherein the preset threshold is greater than or equal to 0, and less than or equal to exposure time for a row of pixels in the fingerprint chip; or wherein the preset threshold is greater than or equal to 0, and less than or equal to unit adjustable time for the calibration register.

8. The clock calibration method according to claim 7, wherein the calibration value is stored into a storage unit of the fingerprint chip.

9. The clock calibration method according to claim 1, wherein the clock calibration method further comprises:
   determining, when the difference between the adjusted current clock of the fingerprint chip and the target clock does not satisfy a preset condition, a new calibration value based on the target clock and the adjusted current clock of the fingerprint chip, and sending the new calibration value to the calibration register in the fingerprint chip, wherein the new calibration value is used to continue to adjust the current clock of the fingerprint chip.

10. The clock calibration method according to claim 1, wherein the clock calibration method is applied to a processor of the electronic device, and the processor is configured to calibrate the clock of the fingerprint chip provided in the electronic device.

11. A clock calibration method, applied to a fingerprint chip provided in an electronic device, comprising:
   receiving, from an processor of the electronic device, a configuration command, and mapping a current clock of the fingerprint chip to a target pin based on the configuration command to output the current clock from the target pin;
   receiving, from the processor, a calibration value for the current clock, and writing the calibration value into a calibration register; and
   adjusting the current clock based on the calibration value;
   wherein the calibration value is determined by the processor performing operations of:
      detecting the target pin to capture n pulse signals of the current clock of the fingerprint chip, wherein n is a positive integer;
      determining the frequency of the current clock based on time for the n pulse signals; and
      determining the calibration value based on the difference between the frequency of the target clock and the frequency of the current clock;
   wherein the detecting the target pin to capture n pulse signals of the current clock of the fingerprint chip, comprises:
      acquiring a sampling clock, wherein the sampling clock is a clock in the electronic device;
      detecting the target pin based on the sampling clock, capturing n rising edges or falling edges of the current clock of the fingerprint chip to capture the n pulse signals of the current clock;
   wherein a frequency of the sampling clock is more than twice the frequency of the current clock of the fingerprint chip.

12. The clock calibration method according to claim 11, wherein a communication pin of the fingerprint chip is multiplexed as the target pin.

13. The clock calibration method according to claim 12, wherein a serial peripheral interface SPI pin or a general-purpose input/output GPIO pin of the fingerprint chip is multiplexed as the target pin.

14. The clock calibration method according to claim 11, wherein the current clock of the fingerprint chip comprises any of:
   a clock source clock, a clock of an exposure module, a clock of an analog-to-digital conversion module, a clock of a communication module and a clock of a clock calibration module.

15. The clock calibration method according to claim 11, wherein the clock calibration method further comprises:
   receiving a storage instruction; and
   storing the calibration value based on the storage instruction, wherein the storage instruction is used to indicate that the difference between the adjusted current clock and the target clock satisfies a preset condition.

16. The clock calibration method according to claim 11, wherein the clock calibration method further comprises:
   receiving a new calibration value for the adjusted current clock, and writing the new calibration value into the calibration register; and
   continuing to adjust the current clock based on the new calibration value.

17. The clock calibration method according to claim 11, wherein the configuration command and the calibration value are sent by a processor of the electronic device.

18. An electronic device, comprising: a processor and a fingerprint chip, wherein
   the processor comprises a clock calibration apparatus for calibrating a clock of the fingerprint chip, the clock calibration apparatus comprising:
      a sending unit, configured to send a configuration command to the fingerprint chip to cause the fingerprint chip to map a current clock of the fingerprint chip to a target pin of the fingerprint chip;

a detection unit, configured to detect the target pin to acquire the current clock of the fingerprint chip;

a processing unit, configured to determine a calibration value based on a target clock and the current clock of the fingerprint chip; and the sending unit, further configured to send the calibration value to a calibration register in the fingerprint chip, the calibration value being used to adjust the current clock of the fingerprint chip, and/or, the fingerprint chip comprises a clock calibration apparatus, the clock calibration apparatus comprising:

a receiving unit, configured to receive a configuration command;

a mapping unit, configured to map a current clock of the fingerprint chip to a target pin based on the configuration command, to output the current clock from the target pin;

the receiving unit, further configured to receive a calibration value for the current clock, and write the calibration value into a calibration register; and an adjusting unit, configured to adjust the current clock based on the calibration value;

wherein the detection unit is configured to: acquire a sampling clock, wherein the sampling clock is a clock in the electronic device; detect the target pin based on the sampling clock, capture n rising edges or falling edges of the current clock of the fingerprint chip to capture n pulse signals of the current clock; determine an frequency of the current clock based on time for the n pulse signals; and determine the calibration value based on the difference between the frequency of the target clock and the frequency of the current clock; wherein a frequency of the sampling clock is more than twice a frequency of the current clock of the fingerprint chip.

* * * * *